United States Patent [19]

Crone

[11] Patent Number: 4,615,110

[45] Date of Patent: Oct. 7, 1986

[54] HAND TOOL FOR INSERTING AND WITHDRAWING A PIN GRID INTO AND FROM A SOCKET

[75] Inventor: Kenneth E. Crone, Dover, Pa.

[73] Assignee: E. I. Du Pont de Nemours and Company, Wilmington, Del.

[21] Appl. No.: 702,369

[22] Filed: Feb. 15, 1985

[51] Int. Cl.⁴ .............................................. B23P 19/02
[52] U.S. Cl. ...................................... 29/741; 29/758; 29/764
[58] Field of Search ................. 29/278, 762, 764, 758, 29/741, 829–840; 72/450

[56] References Cited

U.S. PATENT DOCUMENTS

| | | | |
|---|---|---|---|
| 1,992,596 | 2/1935 | Bangel | 81/43 |
| 2,906,013 | 9/1959 | Kass | 29/278 |
| 3,443,297 | 5/1969 | Lusby, Jr. | 29/203 |
| 3,699,629 | 10/1972 | Hood, Jr. et al. | 29/203 |
| 3,757,406 | 11/1973 | Bezar | 29/203 |
| 3,990,863 | 11/1976 | Palmer | 29/203 |
| 4,141,138 | 2/1979 | Quick | 29/740 |
| 4,172,317 | 10/1979 | Kober et al. | 29/566 |
| 4,215,468 | 8/1980 | Greco | 29/764 |
| 4,392,301 | 7/1983 | Hannes et al. | 29/741 |

FOREIGN PATENT DOCUMENTS

| | | | |
|---|---|---|---|
| 1302295 | 1/1973 | United Kingdom | 29/764 |
| 2055332 | 3/1981 | United Kingdom | 29/764 |

*Primary Examiner*—Howard N. Goldberg
*Assistant Examiner*—P. W. Echols

[57] ABSTRACT

A hand tool has spreadable jaws to grip a pin grid and/or socket. The same jaws are positionable vertically with respect to each other to insert and/or withdraw a pin grid into and from a socket.

9 Claims, 8 Drawing Figures

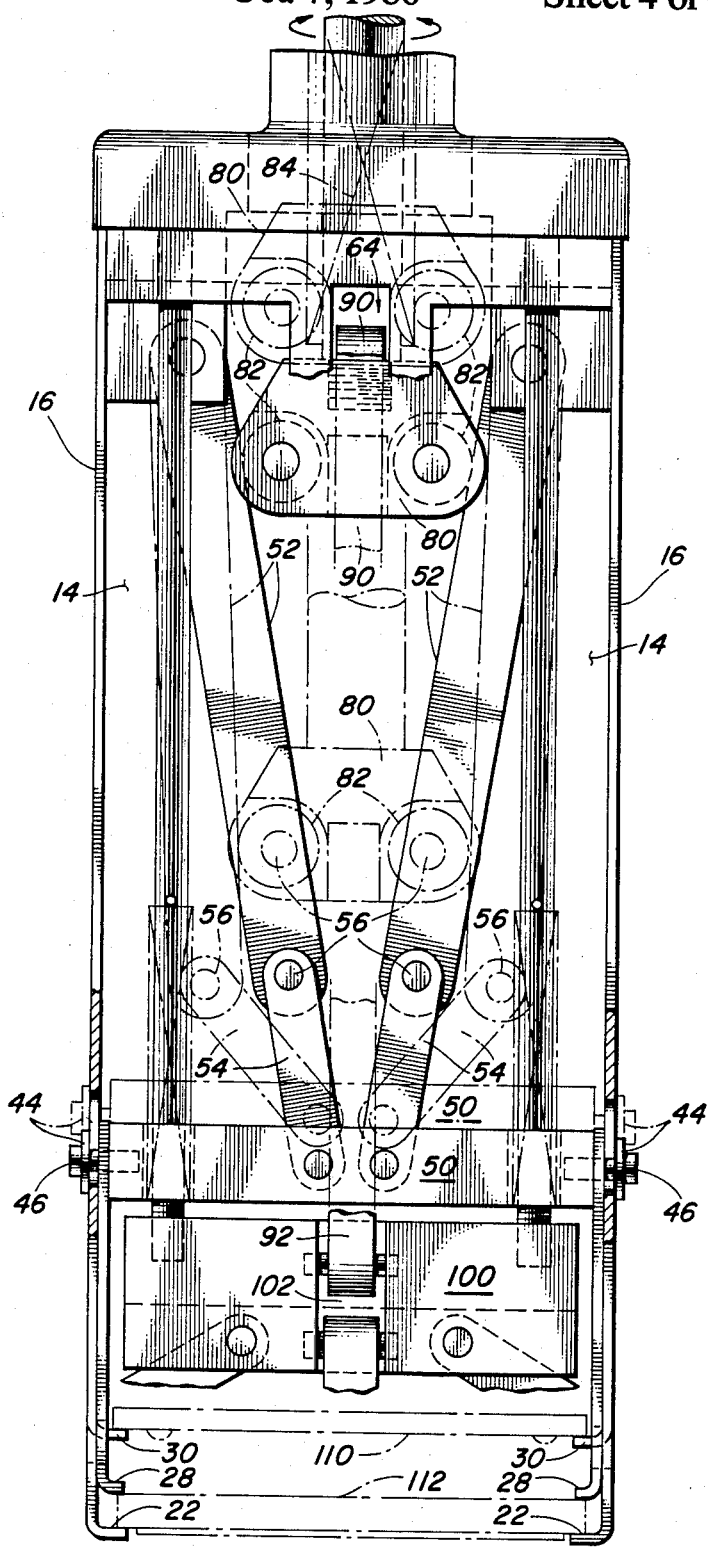
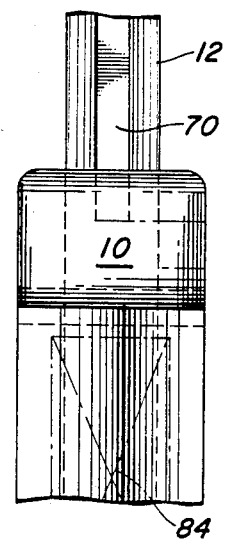
FIG. 4A
FIG. 4

HAND TOOL FOR INSERTING AND WITHDRAWING A PIN GRID INTO AND FROM A SOCKET

BACKGROUND OF THE INVENTION

With the advent of circuit boards, microcircuits which are attached to the circuit boards and the like, the use of pluggable connectors has greatly increased. These pluggable connectors typically consist of a pin engaging socket attached to a circuit board and a pin grid. The pin grid is used to connect other components to that circuit board by plugging the pin grid into the socket. Intitally the connectors used had only a few pins and sockets to be engaged. This did not create much of a problem since the mechanical effort required to overcome the friction of the pins being inserted into the sockets was relatively small. More recently, however, the pin grids and sockets used have greatly increased numbers of pins that usually are closely spaced. Since the friction of the pin and socket connection must be maintained in order to provide good electrical continuity and mechanical stability, it has become increasingly difficult to plug or unplug the pin grids. This is particularly true with pin grids, each having upwards of four and five hundred pins which must be plugged into a socket.

This can be accomplished by inserting the pin grid into the sockets and squeezing the two together. This creates problems however in that this extra force can cause damage to the underlying circuit board on which the socket is mounted. A similar problem exists when the pin grid is withdrawn from the socket.

A number of approaches have been devised to overcome this problem of protecting the underlying circuit board and yet facilitating the insertion and withdrawal of the pin grids from a socket. Thus, U.S. Pat. No. 3,443,297 issued to Lusby and U.S. Pat. No. 3,990,863 issued to Palmer each described hand extraction tools in which the socket board is supported during extraction such that it is not unduly stressed and the circuit board on which it is mounted is not damaged. These hand tools include supports or pins which contact the socket and maintain it in position despite the pulling pressure provided by the tool to withdraw the pin grid. While providing some improvement during extraction, this approach does not provide any protection during the insertion of the pin grid into the socket.

Another patent, U.S. Pat. No. 4,392,301 issued to Hannes et al. describes a hand tool capable of both extracting and inserting pin grids into sockets. Support is provided for the individual pins to the extent possible and the socket board is supported during extraction. Here again, no support is provided for the circuit board during pin insertion. U.S. Pat. No. 1,992,596 issued to Bangel describes a tool which facilitates pin grid insertion by providing a mechanism under which the jaws which hold the pin grid are spread by actuating of a plunger type device. While facilitating the gripping of the pin grid, this tool does not alleviate the problem of damaging of the circuit board which supports the sockets during the insertion of the pin grid.

SUMMARY OF THE INVENTION

Many of the disadvantages of the prior art hand tools are alleviated by the hand tool of this invention. According to this invention, a hand tool for selectively inserting the pins of electronic elements into engagement with and withdrawing the pins from pin engaging sockets secured to a substrate without stressing the substrate comprises a top mounting block having opposite sides, a pair of outer side plates secured at their upper end to the opposite sides of the mounting block and extending downwardly therefrom to define jaws for selectively engaging the elements and sockets, a pair of inner side plates slidably positioned at the lower end of the respective outer side plates and defining jaws at their lower end for selectively engaging the elements and sockets, means for actuating the jaws to engage the elements and sockets, and means to raise the inner side plates and their jaws relative to the outer side plates and their jaws, thereby withdrawing the element pins from pin engaging sockets.

In an alternative embodiment of the invention the hand tool is provided with element tabs which are adapted to engage the top of an element such that the element and socket are drawn together between the inner side plate jaws and the element tabs to insert the pins into the socket. Included in the same hand tool is a spreader mechanism whereby if the plunger is rotated and depressed, the jaws are spread to permit their being placed over a socket and/or element and to engage the same upon returning the plunger to its normal position.

With this arrangement, regardless of whether the element is being inserted into or being withdrawn from the socket, all of the forces are applied only to the element and the socket and not to any underlying circuit board. In the case of insertion of the pins the socket and element are simply squeezed together. In the case of withdrawal of the pins, the element and socket are simply pried apart by the opposing motion of the jaws on the inner and outer side plates.

BRIEF DESCRIPTION OF THE DRAWINGS

The invention may be more fully understood from the following detailed description thereof taken in connection with accompanying drawings which form a part of this application and in which:

FIGS. 4 and 4A are side elevation views of the hand tool of FIG. 3 rotated ninety degrees to particularly depict the jaw moving arrangement;

DETAILED DESCRIPTION OF THE PREFERRED EMBODIMENT

Figure 1:
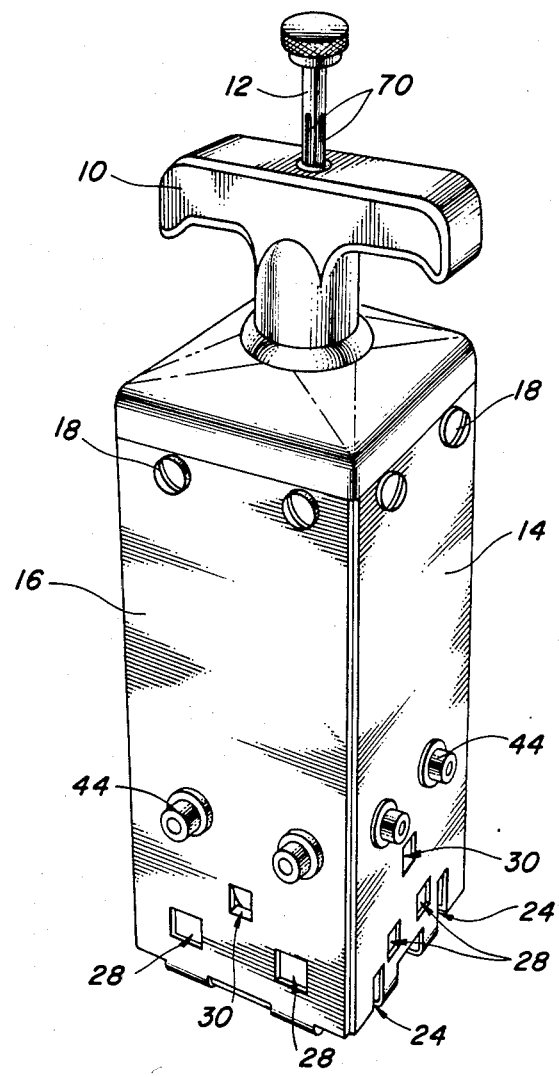
FIG. 1 is a pictorial representation of a hand tool constructed in accordance with this invention.
Figure 2:
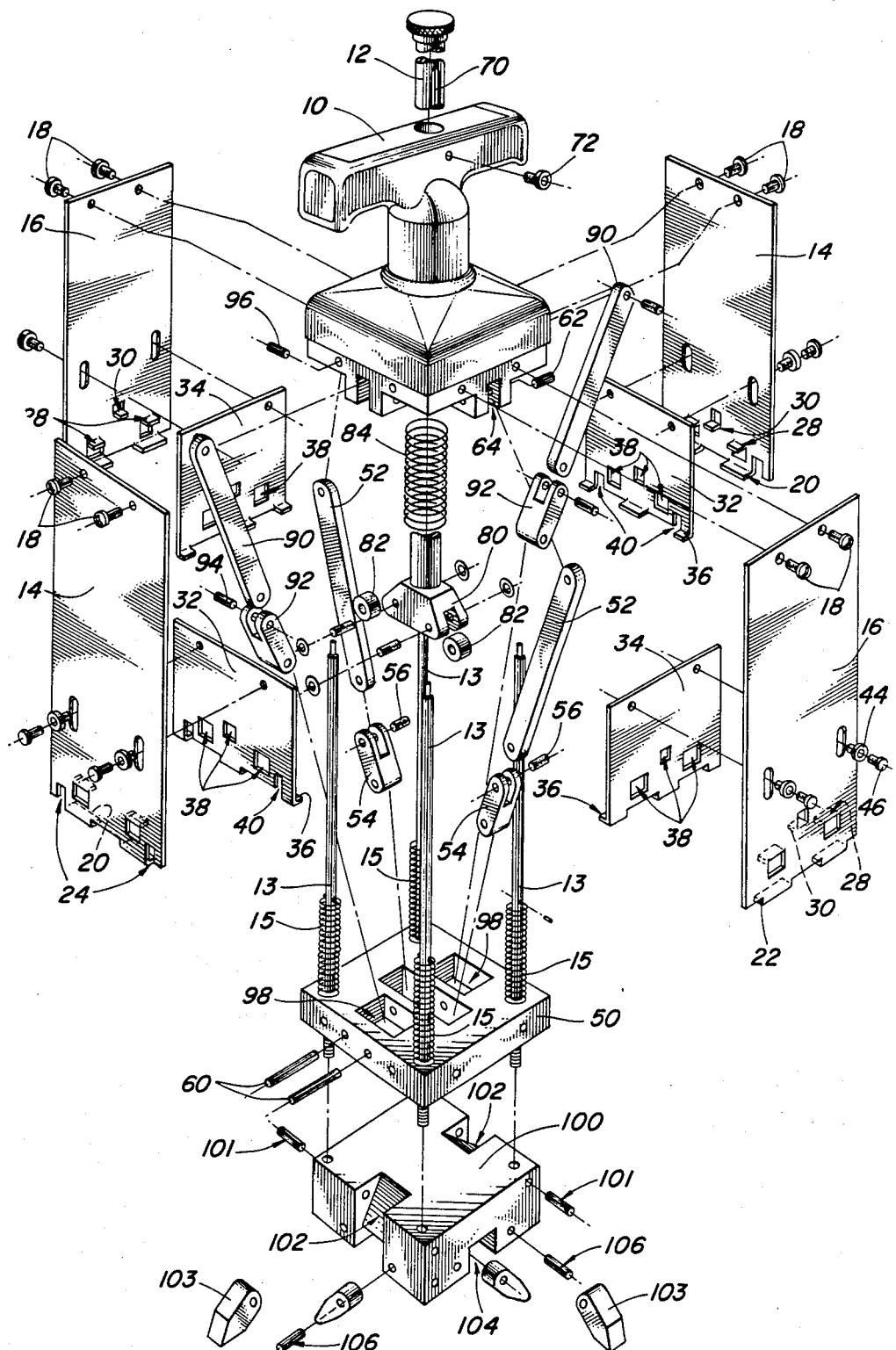
FIG. 2 is an exploded view of the hand tool depicted in FIG. 1.
Figures 3, 3A:
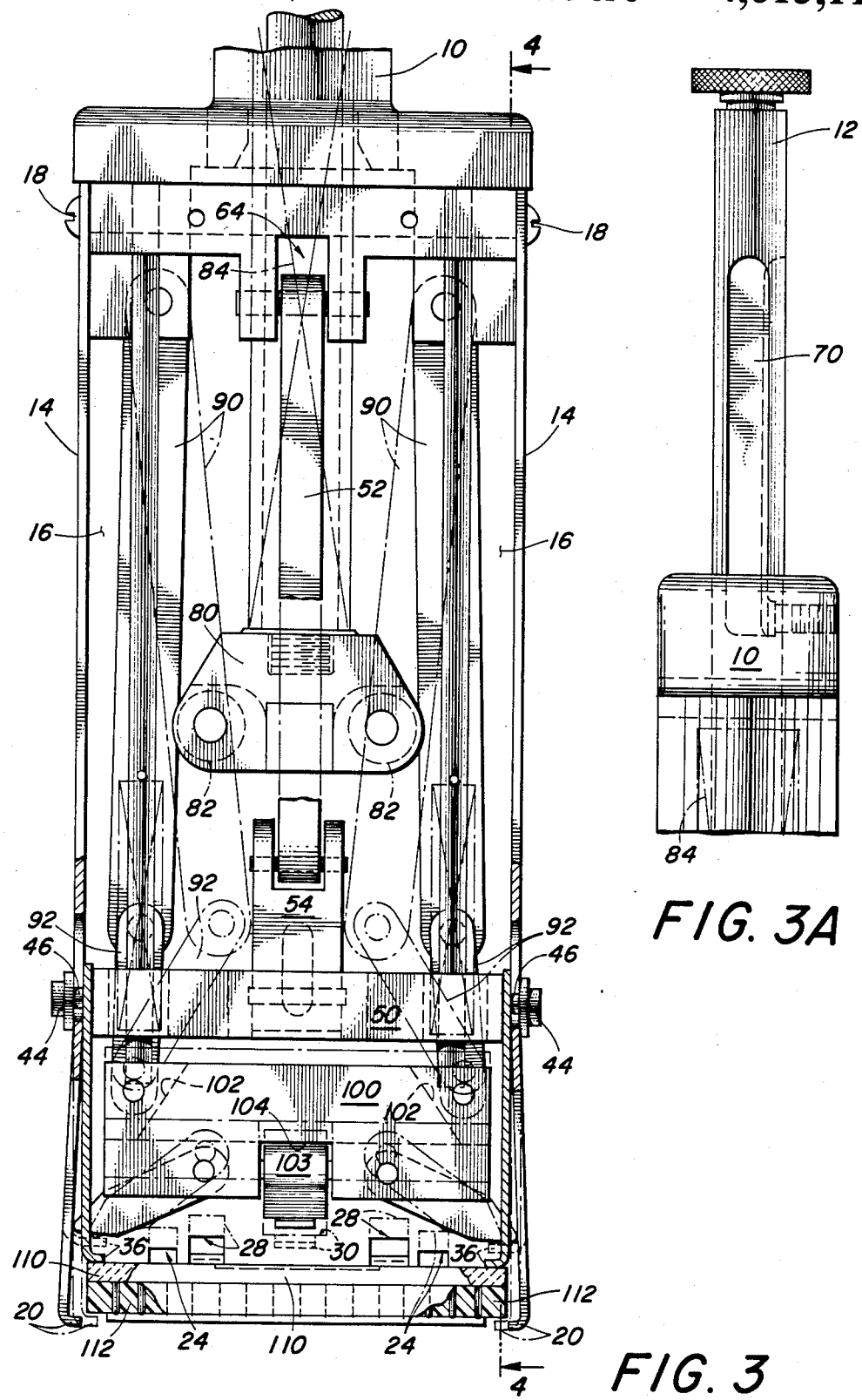
FIGS. 3 and 3A are side elevation views of the hand tool with one side removed particularly depicting the jaw spreading arrangement.

The hand tool of this invention may be most clearly seen in FIGS. 1 and 2. In these figures it may be seen that top mounting block 10 has a plunger 12 which may be rotatably indexed between first and second orthogonal positions. The bottom portion of the top mounting block is rectangular. The tops of pairs of orthogonally positioned side plates 14 and 16 are secured thereto as by screws 18. The bottom portion of each of the pairs of side plates 14 and 16 is bent inwardly to form jaws 20 and 22, respectively. In both pairs of side plates 14 and 16, notches 24 are formed to cooperate with the pin grid and socket as will be described. Also tabs 28 for engaging the socket or pin grid are formed in like manner. A spreader link lip 30 is formed in the side plates to engage spreader links, as will be described.

Corresponding pairs of inside plates 32 and 34 are formed, each having inwardly bent tabs which form jaws 36 on the lower edge. The plates 32 and 34 also have cut outs 38 to accommodate the socket tabs 28 and link lip 30. In addition the pair of opposite plates 32 have notches 40 which correspond to notches 24 in the side plates 14 and which are also formed to cooperate with the pin grid and socket as will be described. The side plates 14 and 16 are slidably secured to the corresponding inside plate pairs 32 and 34 by the use of spacer bushings 44 secured by screws 46 tapping corresponding sides of a link mounting block 50. The jaws 36 and 22 are interleaved. A first set of articulated upper and lower links 52 and 54 each pivoted by a dowel pin 56 have either end pivotably mounted at the bottom in the link mounting block 50 as by pins 60 and at their top end as by a dowel 62 into grooves 64 formed in the bottom surface of the top mounting block. Thus this first set of oppositely disposed links is connected from the outer peripheral surface of the top mounting block into the central portion of the link mounting block such that when they are spread, the distance between their end points is decreased and the link mounting block is lifted.

The plunger rod 12 is formed with two longitudinal grooves 70 spaced at about 90 degrees away from each other. The bottom portions of the two grooves 70 are coupled by a circumferential groove, a guide screw 72 engages these grooves. The lower end of the plunger rod 12 is connected to a bearing block 80 in either side of which is mounted a bearing 82 adapted to engage the articulated top and bottom links 52 and 54 as well as a second set of upper and lower articulated links 90 and 92 described below. A coil spring 84 biases the plunger rod downwardly to a limited extent to prevent the guide screw from entering the circumferential groove. However, the plunger rod 12 may be lifted against the bias of the spring 84 and rotated or indexed to such that the guide screw 72 engages one or the other of the grooves 70, thus rotating the bearing block by 90 degrees so as to engage the first set of links 52 and 54 or the second set of links 90 and 92.

The second set of links 90 and 92 are articulated by a dowel pin 94 at their mid-point and connected to the outer portion of the top mounting block pivotally by a dowel pin 96. The lower end of each of the links 92 extends through openings 98 in the link mounting block 50 and engages a spreader mounting block 100 positioned below the link mounting block 50. Notches 102 are formed in the upper surface of the spreader mounting block to accommodate these lower links 92 which are held by dowel pins 101. It should be noted that the articulated links 90 and 92 lie in a plane orthogonal to the plane containing the links 52 and 54, which raise and lower the link mounting block 50. The links 90 and 92 are sized such that their overall length is greater than that between the spreader mounting block and top mounting block such that the links are articulated inwardly. In this manner when the plunger is depressed and the bearings 82 engaged, the links 90 are straightened out, thereby pushing downward the spreader mounting block 100.

Guide rods 13 are located between the top mounting block 10 and the spreader mounting block 100. The guide rods extend downward from the top mounting block 10 and extend through the link mounting block 50. Springs 15 are positioned on the guide rods 13 to load the link mounting block downward.

Additional notches 104 are formed in the lower face of the spreader mounting block 100. Spreader links 103 are pivotally mounted as by appropriate pins 106 in each of these notches 104. The outer end of each of the links 103 engages a spreader link lip 30 formed in the respective side plates 14 and 16. All of the material used in constructing the hand tool may be stainless steel or other suitable rigid material having a high tensile strength.

It may thus be seen that this hand tool performs two functions. Firstly, by rotating and indexing the plunger to a first position, such that the bearings 82 lie in the plane of the links 90, 92, the jaws 20, 22 and the lower portions of inside plates 32, 34 are spread or opened. Alternatively by indexing the plunger 12 to the second position such that the bearings 82 are in alignment with the links 52, 54, depressing the plunger will raise the link mounting block 50. This will vertically raise the inside plates 32 and 34 while the side plates 14 and 16 remain stationary, thereby separating the jaws 36 of inside plates 32 and 34 from jaws 20, 22 so that they may either extract from or insert a pin grid into a socket. The single plunger on the top of the tool facilitates the performance of both functions.

The plunger can be indexed between the first and second positions by first lifting the plunger until it stops, thus placing the circumferential groove in alignment with the guide screw 72 and rotating the plunger until it stops or is indexed to the second position. The plunger is then released and the plunger remains locked in that position until it is returned to its first position.

Figure 6:
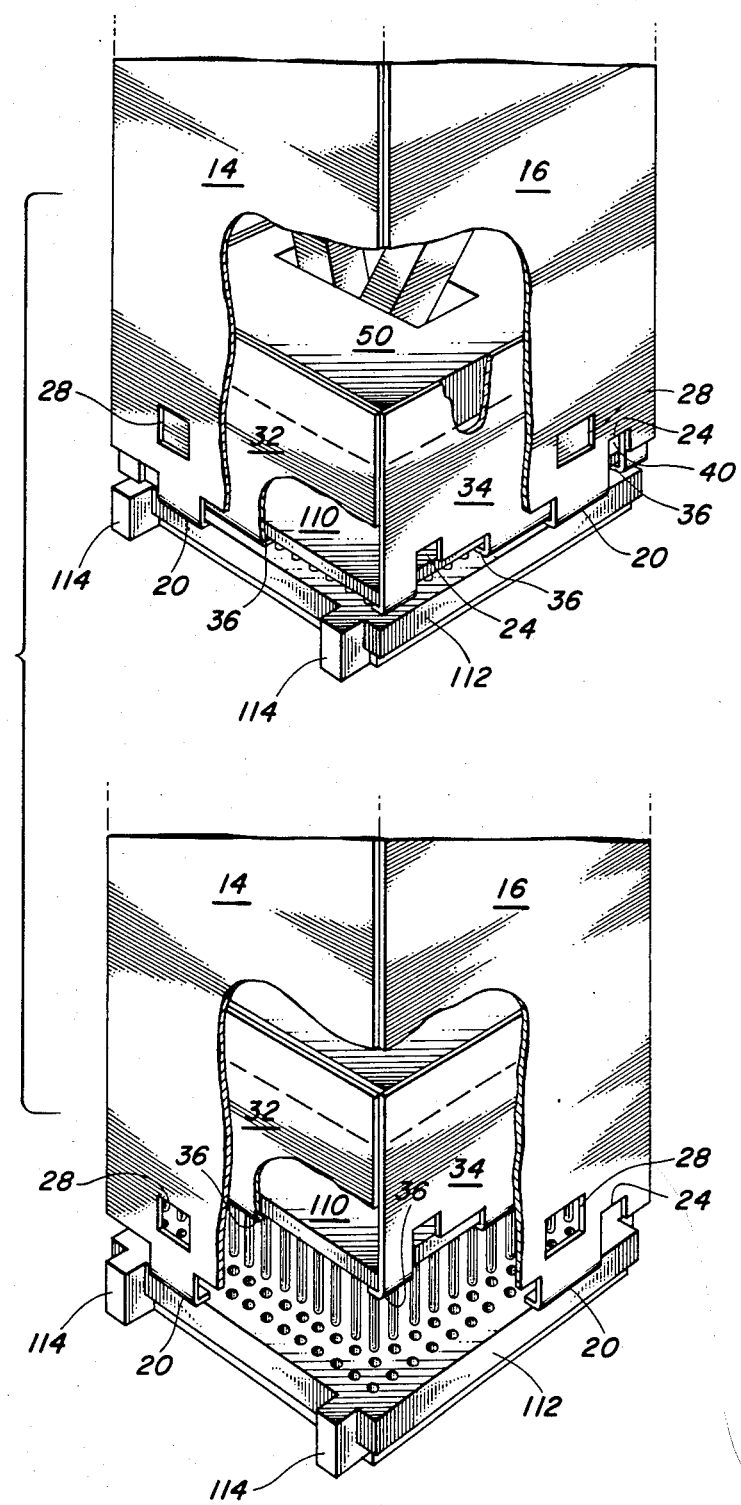
FIG. 6 is a partially cut-away pictorial representation of the hand tool of this invention being used to remove a pin grid from a socket.

Typically in operation, the plunger is indexed to its first position to spread the jaws and engage the socket or pin grid as the case may be and then indexed to its second position to extract or insert a pin grid into the socket. Thus, to remove a pin grid 110 from a socket 112 (FIG. 6), the plunger is indexed to its first position such that the bearings 82 are in alignment with the links 90, 92. The plunger is depressed causing the links 90, 92 to straighten and push the spreader mounting block 100 downwardly.

When the spreader mounting block 100 is lowered, the spreader links 103 engaging the spreader link lips 30 force the side plates outwardly so that they may be placed over the pin grid and/or socket. As the hand tool is lowered down over the pin grid, the lower portion of the jaws rest on the four lugs 114 at the outer perimeter of the socket and can be seen most clearly in FIG. 6. Next the plunger is released allowing the jaws 20, 22 and 36 to close and engage the space between the pin grid and the socket. With the hand tool in this position, the plunger is rotated to its second position and the plunger again depressed. This initiates a vertical sliding motion between the inner and outer jaws with the inner jaws being raised thus prying the pin grid from the socket. All of the pressure is between the pin grid and the socket. No pressure is applied to the circuit board on which the socket is mounted.

Figure 5:
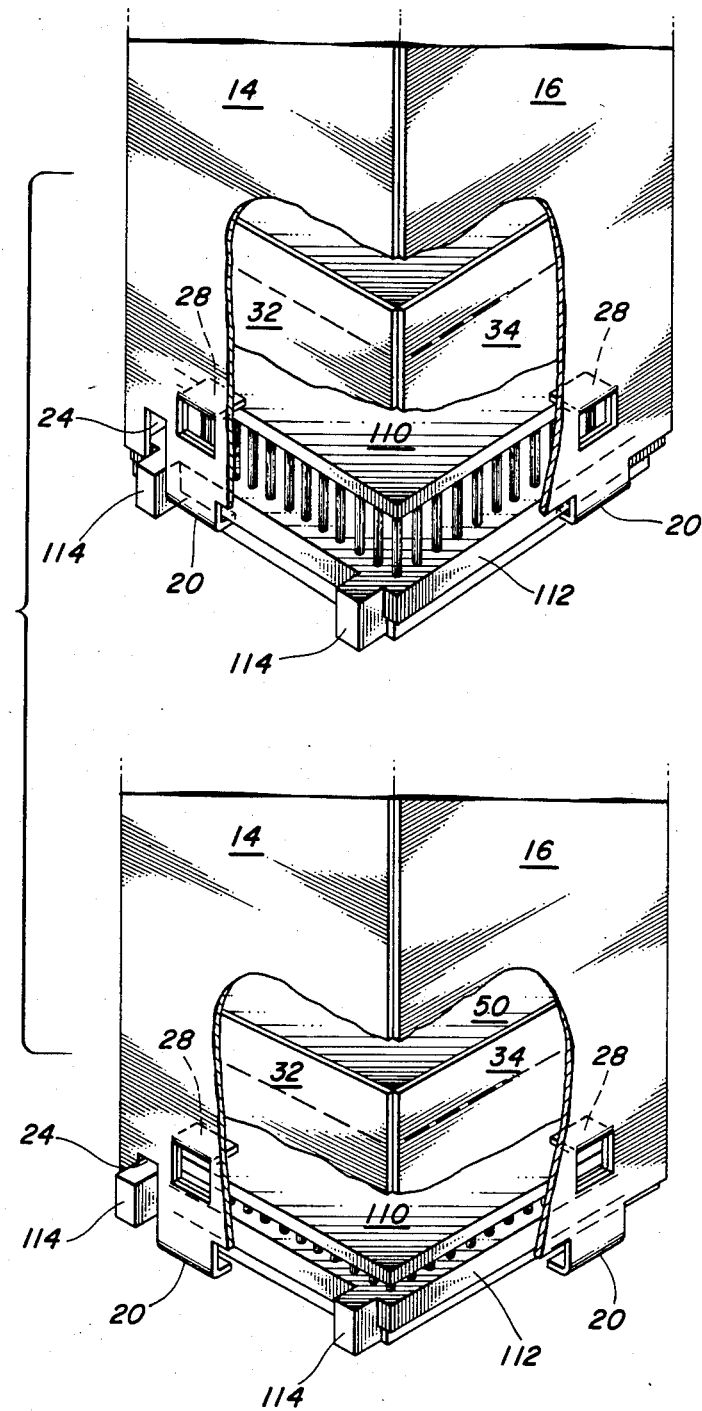
FIG. 5 is a partially cut-away drawing depicting the pin insertion operation using the hand tool of this invention.

Next, to insert a pin grid into a socket, initially the pin grid is started into the socket by hand. Next the position of the hand tool is rotated 90 degrees from that used in order to extract the pin grid such that when the hand tool is lowered with the jaws in an open position down over the pin grid and the socket, the slots 24 and 40 in the inner and outer plates are in line with the four lugs 114 in the outer perimeter of the socket as is seen most clearly in FIG. 5. This permits the jaws 20, when the plunger is released, to close on the bottom of the socket. The plunger is now indexed into its second position to actuate the jaws and the plunger again depressed. The bottom jaw is now grabbed underneath the flange of the socket and the socket tabs 28 engage the top of the pin grid. With the relative motion between the socket tabs 28 and the jaws 20, the pin grid is forced or squeezed into the socket.

Finally, if the plunger is moved back to its first position and again depressed to spread the jaws, the hand tool may be lifted from the socket. It should be noted that during this operation of inserting the pin grid into the socket, all forces are applied to the pin grid and the socket. No force is applied to the underlying circuit board substrate.

The operation of the tool is relatively simple, uncomplex and failproof in permitting the insertion and extraction of pin grids into and from a socket without causing undue stress on the circuit board on which the socket may be mounted.

What is claimed is:

1. A hand tool for selectively inserting the pins of electronic elements into engagement with and withdrawing the pins from pin engaging sockets secured to a substrate comprising:
    a top mounting block having opposite sides,
    a pair of outer side plates secured at their upper end to the opposite sides of the mounting block and extending downwardly therefrom to define jaws for selectively engaging the elements and sockets,
    a pair of inner side plates slidably positioned at the lower end of the respective outer side plates and defining jaws at their lower end for selectively engaging the elements and sockets,
    means for actuating the jaws to engage the elements and sockets, and
    means for raising the inner side plates and their jaws relative to the outer side plates and their jaws, thereby withdrawing the element pins from pin engaging sockets, said raising means including a link mounting block slidably positioned between the side plates, a first pair of articulated link sets pivotably linking the top mounting block with the link mounting block and a plunger slidably positioned in the top mounting block to slidingly engage and and spread the link sets in a first plane, thereby pulling the link and top mounting blocks toward each other to raise the inner side plates.

2. A hand tool as set forth in claim 1 in which the outer side plates define element tabs for engaging the top of an element and cooperate with the raising of the inner side plate jaws to compress the element and socket together between the inner side plate jaws and the element tabs, thereby to insert the pins into the sockets.

3. A hand tool as set forth in claim 1 which includes guide rods extending downwardly from the top mounting block and extending through the link mounting block and spring positioned on the guide rods to load the link mounting plate downwardly.

4. A hand tool as set forth in claim 3 wherein the top mounting block is rectangular, and the tool further includes a second pair of outer side plates each secured at their upper end to the remaining two sides of the rectangular mounting block, and a second pair of inner side plates slidably positioned at the lower end of respective ones of the second pair of outer side plates and defining jaws at their lower end.

5. A hand tool as set forth in claim 1 wherein the raising means further includes a spreader mounting block slidably positioned between the side plates, a second pair of articulated link sets pivotally linking opposite peripheral portions of the mounting block with the outer portion of the spreader mounting block, the plunger rod being slidably positioned in the top mounting block to slidingly engage and spread the link sets in a second plane, thereby pushing the spreader and top mounting blocks away from each other.

6. A hand tool as set forth in claim 1 which further includes
    a spreader mounting block slidably positioned below the link mounting block,
    spreader links secured to the spreader mounting block engaging link lips formed in the outer side plates,
    a second pair of articulated link sets pivotally linking opposite peripheral portions of the mounting block with the outer portion of the spreader mounting block, and
    the plunger being slidably positioned in the top mounting block to slidingly engage and extend the link sets, thereby pushing the spreader mounting block away from the top mounting block and spreading the side plates and jaws apart to engage the elements and sockets.

7. A hand tool as set forth in claim 1 wherein the first pair of articulated link sets pivotally link opposite peripheral portions of the top mounting block with a central portion of the link mounting block.

8. A hand tool as set forth in claim 7 which further includes
    a spreader mounting block slidably positioned below the link mounting block,
    spreader links secured to the spreader mounting block engaging link lips formed in the outer side plates,
    a second pair of articulated link sets pivotally linking opposite peripheral portions of the mounting block with the outer portion of the spreader mounting block, and
    the plunger being slidably positioned in the top mounting block to slidingly engage and extend the link sets, thereby pushing the spreader mounting block away from the top mounting block and spreading the side plates and jaws apart to engage the elements and sockets, said plunger rod being rotatable to engage one of the first and second pairs of link sets.

9. A hand tool as set forth in claim 8 which includes guide rods extending downwardly from the top mounting block and extending through the link mounting block and spring positioned on the guide rods to load the link mounting plate downwardly, the guide rod extending through the spreader mounting block to slidingly support the same.

* * * * *